United States Patent [19]
Enoki et al.

[11] Patent Number: 5,151,757
[45] Date of Patent: Sep. 29, 1992

[54] HETEROJUNCTION FIELD-EFFECT TRANSISTOR

[75] Inventors: Takatomo Enoki; Naoteru Shigekawa; Kunihiro Arai, all of Kanagawa, Japan

[73] Assignee: Nippon Telegraph and Telephone Corporation, Tokyo, Japan

[21] Appl. No.: 781,851

[22] Filed: Oct. 24, 1991

[30] Foreign Application Priority Data

Oct. 26, 1990 [JP] Japan .................................. 2-290187

[51] Int. Cl.⁵ ............................................ H01L 29/80
[52] U.S. Cl. ..................................... 357/22; 357/16; 357/15
[58] Field of Search .............................. 357/15, 16, 22

[56] References Cited

U.S. PATENT DOCUMENTS

5,105,241  4/1992  Ando .................................... 357/16

FOREIGN PATENT DOCUMENTS

1-143264  6/1989  Japan .

OTHER PUBLICATIONS

Mishra et al., "The AlInAs–GaInAs HEMT for Microwave and Millimeter-Wave Applications", IEEE Transactions on Microwave Theory and Techniques, vol. 37, No. 9, Sep. 1989, pp. 1279–1285.

Primary Examiner—Edward J. Wojciechowicz
Attorney, Agent, or Firm—Blakely, Sokoloff, Taylor & Zafman

[57] ABSTRACT

A heterojunction field-effect transistor includes a first electron transit channel formation semiconductor layer formed on a substrate and consisting of a compound semiconductor, a first electron supply semiconductor layer formed on the first electron transit channel formation semiconductor layer and consisting of a compound semiconductor, a gate electrode, a source electrode, and a drain electrode formed on the first electron supply semiconductor layer, and a second electron transit channel formation semiconductor layer formed between the substrate and the first electron transit channel formation semiconductor layer. The second electron transit channel formation semiconductor layer consists of a cmpound semiconductor which has electron affinity smaller than that of the first electron transit channel formation semiconductor layer and larger than that of the first electron supply semiconductor layer, and is different from the first electron transit channel formation semiconductor layer in field strength position where a maximum value of an electron velocity is obtained, and is arranged such that an energy level on a bottom of an electron conduction band of the second electron transit channel formation seimconductor layer is substantially the same as a Fermi level.

9 Claims, 5 Drawing Sheets

HETEROJUNCTION FIELD-EFFECT TRANSISTOR

BACKGROUND OF THE INVENTION

The present invention relates to a heterojunction field-effect transistor.

A heterojunction field-effect transistor is one of various types of conventionally developed high-speed transistors.

This conventional heterojunction field-effect transistor has, for example, an arrangement as shown in FIG. 9.

Referring to FIG. 9, this transistor employs a semi-insulating semiconductor substrate 1 consisting of a compound semiconductor such as InP, and a buffer semiconductor layer 2, which consists of a compound semiconductor such as InAlAs and is intentionally not doped with either an n- or p-type impurity or is doped with either impurity at only a sufficiently low concentration, is formed on the semiconductor substrate 1. A channel formation semiconductor layer 3, which consists of a compound semiconductor such as InGaAs having electron affinity larger than that of the buffer semiconductor layer 2 and is intentionally not doped with either an n- or p-type impurity or is doped with either impurity at only a sufficiently low concentration, is formed on the buffer semiconductor layer 2.

An electron supply semiconductor layer 5, which consists of a compound semiconductor such as InAlAs having electron affinity smaller than that of the channel formation semiconductor layer 3 and is doped with an n-type impurity at a high concentration, is formed on the channel formation semiconductor layer 3 via a spacer semiconductor layer 4. The spacer semiconductor layer 4 consists of a compound semiconductor such as InAlAs having electron affinity smaller than that of the channel formation semiconductor layer 3, and is intentionally not doped with either an n- or p-type impurity or is doped with either impurity at only a sufficiently low concentration.

An electrode mounting semiconductor layer 6, which consists of a compound semiconductor such as InGaAs and is doped with an n-type impurity at a high concentration, is formed on the electron supply semiconductor layer 5. A window 7 for externally exposing the electron supply semiconductor layer 5 is formed in the electrode mounting semiconductor layer 6.

A gate electrode 8 is arranged on a region of the electron supply semiconductor layer 5, which corresponds to the window 7 of the electrode mounting semiconductor layer 6, so as to form a Schottky junction 9. On the electrode mounting semiconductor layer 6, a source electrode 10 and a drain electrode 11 are arranged on the left and right sides of the window 7 and therefore the gate electrode 8 so as to be in ohmic contact with the electrode mounting semiconductor layer 6.

According to the conventional heterojunction field-effect transistor having the above arrangement, electrons are supplied from the electron supply semiconductor layer 5 to the channel formation semiconductor layer 3 through the spacer semiconductor layer 4, so that an electron gas layer 13 is formed in a region of the channel formation semiconductor layer 3, which is located on the side of the spacer semiconductor layer 4.

When a control voltage is applied to the gate electrode 8 with respect to the source electrode 10 such that the voltage is superposed on a bias voltage sufficient to allow a depletion layer to expand from the Schottky junction 9 toward the semi-insulating semiconductor substrate 1 to reach or almost reach the heterojunction between the spacer semiconductor layer 4 and the channel formation semiconductor layer 3, the concentration of electrons in the channel formation semiconductor layer 3 according to electrons in the electron gas layer 13 is controlled in accordance with the value of the control voltage.

By, therefore, connecting a predetermined power source having a positive terminal on the drain electrode 11 side between the source electrode 10 and the drain electrode 11 via a load, a current corresponding to the control voltage can be supplied to the load to realize the function as a field-effect transistor.

In the conventional heterojunction field-effect transistor as shown in FIG. 9, however, since only one electron gas layer 13 is formed in the channel formation semiconductor layer 3 upon supply of electrons from the electron supply semiconductor layer 5, an average electron concentration in the channel formation semiconductor layer 3 cannot be sufficiently increased. Therefore, a current value to be supplied to the load cannot be increased.

In addition, when the conventional heterojunction field-effect transistor as shown in FIG. 9 achieves the function as a field-effect transistor described above, the field strength in a region of the channel formation semiconductor layer 3, which is located below the gate electrode 8, gradually increases from the end of the region located on the side of a region below the source electrode 10 toward its other end located on the side of a region below the drain electrode 11. However, in a compound semiconductor such as InGaAs constituting the channel formation semiconductor layer 3, the velocity of electrons which transit in the semiconductor shows a field strength dependency having a maximum value at a lower field strength position, as shown in FIG. 3. Therefore, a comparatively high electron velocity can be obtained in the portion of the region of the channel formation semiconductor layer 3, which is located below the gate electrode 8 and on the side of the region below the source electrode 10, whereas only a comparatively low electron velocity can be obtained in the portion of the region of the channel formation semiconductor layer 3, which is located below the gate electrode 8 and on the side of the region below the drain electrode 11. For this reason, the average velocity of electrons transiting in the channel formation semiconductor layer 3 is comparatively low. As a result, no good high-frequency characteristics as a field-effect transistor can be obtained.

Furthermore, in the conventional heterojunction field-effect transistor shown in FIG. 9, a narrow gap 12 is generally formed between the gate electrode 8 and the electrode mounting semiconductor layer 6 for the following reason. That is, a portion of the gate electrode 8, which is in direct contact with the electrode mounting semiconductor layer 6 doped with an n-type impurity at a high concentration, exhibits not Schottky characteristics but ohmic characteristics. Therefore, a gate leakage current flows directly from the gate electrode 8 to the electrode mounting semiconductor layer 6 to make it impossible to control the two-dimensional electron gas 13 in the channel formation semiconductor layer 3. The gap 12 is formed to avoid this inconvenience. However, the surface potential of the gap 12 easily changes because it is exposed to the atmosphere, chemicals, a plasma, and the like during the manufacture of a heterojunction field-effect transistor. In addition, the presence of the gap 12 allows the depletion layer below the gate electrode 8 to expand to a region below the gap 12, thereby reducing the concentration of the two-dimensional electron gas 13 in a region of the channel formation semiconductor layer 3 below the gap 12. This increases the source resistance and the drain resistance of the heterojunction field-effect transistor to significantly degrade its device characteristics. A degree of this reduction largely varies in accordance with the manufacturing steps of a heterojunction field-effect transistor, or the reduction significantly degrades stability of the device characteristics even after the transistor is manufactured.

The conventional heterojunction field-effect transistor shown in FIG. 9 must have a threshold voltage $V_{th}$ determined by the type of a circuit using this heterojunction field-effect transistor. When this threshold voltage is applied to the gate electrode 8 with respect to the source electrode 10, a field strength $E_s$ in the Schottky junction 9 is given by $E_s = 2(V_{bi} - V_{th})/d$ where d is the thickness of the electron supply semiconductor layer 5 and $V_{bi}$ is the built-in potential present in the electron supply semiconductor layer 5, the spacer semiconductor layer 4, and the channel formation semiconductor layer 3. In order to ensure the breakdown voltage of the gate electrode, $E_s$ must be decreased to be a predetermined value or less, which is determined by a semiconductor material concerned. As is apparent from the equation stated above, since $E_s$ is determined by only d provided that $V_{th}$ is fixed, d cannot be decreased. However, a transconductance $g_m$ of the transistor is given by $g_m = \epsilon V_s/d$ ($V_s$ = electron velocity), and it is impossible to increase the transconductance. Therefore, it is difficult to improve the characteristics of the transistor while ensuring the gate breakdown voltage.

SUMMARY OF THE INVENTION

It is, therefore, a principal object of the present invention to provide a heterojunction field-effect transistor having improved characteristics compared with those of conventional heterojunction field-effect transistors.

It is another object of the present invention to provide a heterojunction field-effect transistor having improved high-frequency characteristics compared with those of conventional heterojunction field-effect transistors.

It is still another object of the present invention to provide a heterojunction field-effect transistor having stable device characteristics compared with those of conventional heterojunction field-effect transistors.

It is still another object of the present invention to provide a heterojunction field-effect transistor which improves its characteristics while ensuring a gate breakdown voltage.

In order to achieve the above objects of the present invention, there is provided a heterojunction field-effect transistor comprising a first electron transit channel formation semiconductor layer formed on a substrate and consisting of a compound semiconductor, a first electron supply semiconductor layer formed on the first electron transit channel formation semiconductor layer and consisting of a compound semiconductor, a gate electrode, a source electrode, and a drain electrode formed on the first electron supply semiconductor layer, and a second electron transit channel formation semiconductor layer formed between the substrate and the first electron transit channel formation semiconductor layer, wherein the second electron transit channel formation semiconductor layer consists of a compound semiconductor which has electron affinity smaller than that of the first electron transit channel formation semiconductor layer and larger than that of the first electron supply semiconductor layer, and is different from the first electron transit channel formation semiconductor layer in field strength position where a maximum value of an electron velocity is obtained, and is arranged such that an energy level on a bottom of an electron conduction band of the second electron transit channel formation semiconductor layer is substantially the same as a Fermi level.

DETAILED DESCRIPTION OF THE PREFERRED EMBODIMENTS

Figure 1:
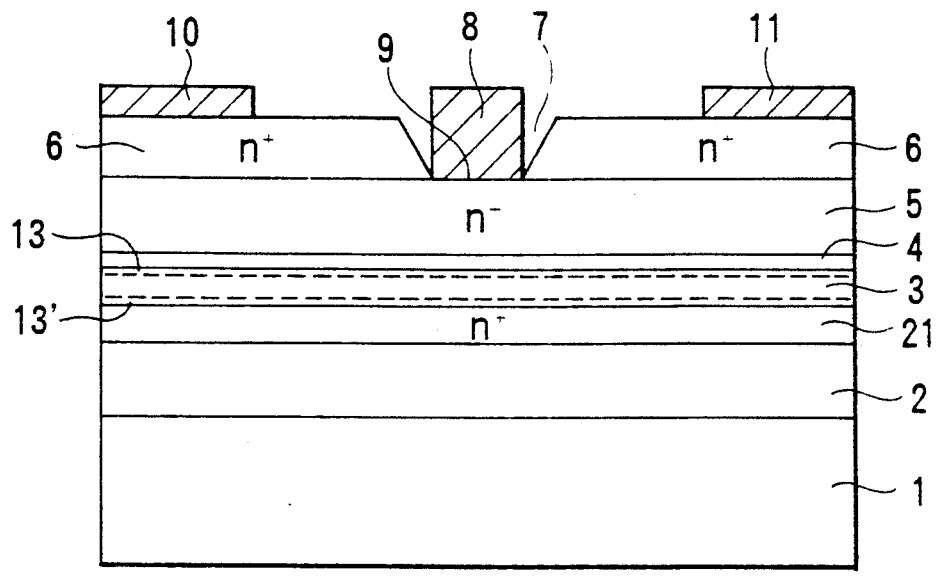
FIG. 1 is a schematic sectional view showing the first embodiment of the heterojunction field-effect transistor according to the present invention.

FIG. 1 shows the first embodiment of the heterojunction field-effect transistor according to the present invention. Referring to FIG. 1, in this transistor, a buffer semiconductor layer 2, which consists of a compound semiconductor such as InAlAs and is intentionally not doped with either an n- or p-type impurity or is doped with either impurity at only a sufficiently low concentration, is formed on a semi-insulating semiconductor substrate 1 consisting of a compound semiconductor such as InP. A first electron transit channel formation semiconductor layer 3, which consists of a compound semiconductor such as InGaAs having electron affinity larger than that of the buffer semiconductor layer 2 and is intentionally not doped with either an n- or p-type impurity or is doped with either impurity at a sufficiently low concentration, is formed on the buffer semiconductor layer 2 via a second electron transit channel formation semiconductor layer 21 which is a characteristic feature of the present invention and will be described in detail later.

An electron supply semiconductor layer 5, which consists of a compound semiconductor such as InAlAs having electron affinity smaller than that of the channel formation semiconductor layer 3 and is doped with an n-type impurity at a high concentration, is formed on the channel formation semiconductor layer 3 via a spacer semiconductor layer 4. The spacer semiconductor layer 4 consists of a compound semiconductor such as InAlAs having electron affinity smaller than that of the channel formation semiconductor layer 3 and is intentionally not doped with either an n-or p-type impurity or is doped with either impurity at only a sufficiently low concentration.

An electrode mounting semiconductor layer 6, which consists of a compound semiconductor such as InGaAs and is doped with an n-type impurity at a high concentration, is formed on the electron supply semiconductor layer 5. A window 7 for externally exposing the electron supply semiconductor layer 5 is formed in the electrode mounting semiconductor layer 6.

A gate electrode 8 is arranged on a region of the electron supply semiconductor layer 5, which corresponds to the window 7 of the electrode mounting semiconductor layer 6, so as to form a Schottky junction 9. On the electrode mounting semiconductor layer 6, a source electrode 10 and a drain electrode 11 are arranged on the left and right sides of the window 7 and therefore the gate electrode 8 so as to be in ohmic contact with the electrode mounting semiconductor layer 6.

The second electron transit channel formation semiconductor layer 21 as a characteristic feature of the present invention is formed between the buffer semiconductor layer 2 and the channel formation semiconductor layer 3. This semiconductor layer 21 consists of a compound semiconductor such as InP, which has electron affinity smaller than that of the channel formation semiconductor layer 3 and larger than those of the spacer semiconductor layer 4, the electrode mounting semiconductor layer 6, and the buffer semiconductor layer 2 and is different from the channel formation semiconductor layer 3 in field strength position where the maximum value of an electron velocity is present, and is doped with an n-type impurity at a high concentration.

The foregoing is an arrangement of the first embodiment of the heterojunction field-effect transistor according to the present invention.

Figure 2:
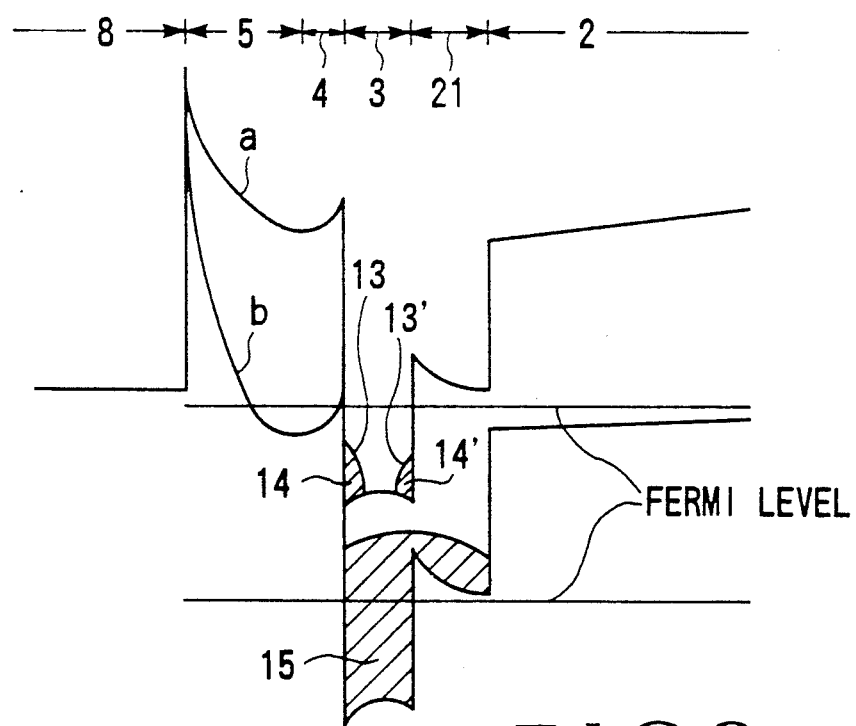
FIG. 2 is a band diagram for explaining the first embodiment.

According to the heterojunction field-effect transistor of the present invention having the above arrangement, as indicated by a thin line a in FIG. 2, a two-dimensional electron gas 13 is formed in a region of the channel formation semiconductor layer 3, which is located on the side of the electron supply semiconductor layer 5, and an electron gas layer 13' is formed in a region of the first electron transit channel formation semiconductor layer 3, which is located on the side of the second electron transit channel formation semiconductor layer 21, because of the presence of the second electron transit channel formation semiconductor layer 21. The electron concentrations in the electron gas layers 13 and 13' are controlled in accordance with a control voltage applied to the gate electrode 8. In this condition, as is the case with the conventional heterojunction field-effect transistor shown in FIG. 9, a current corresponding to the control voltage applied to the gate electrode 8 can be supplied to a load.

In the heterojunction field-effect transistor according to the present invention shown in FIG. 1, however, as indicated by the thin line a, the electron gas 13 is formed in the region of the first electron transit channel formation semiconductor layer 3, which is located on the side of the electron supply semiconductor layer 5, since the electron supply semiconductor layer 5 is formed above and adjacent to the first electron transit channel formation semiconductor layer 3, and the other electron gas 13' is formed in the region of the first electron transit channel formation semiconductor layer 3, which is located on the side of the second electron transit channel formation semiconductor layer 21, since the second electron transit channel formation semiconductor layer 21 is formed below and adjacent to the first electron transit channel formation semiconductor layer 3. Therefore, an average electron concentration in the first electron transit channel formation semiconductor layer 3 of the heterojunction field-effect transistor of the present invention is twice or almost twice that in the conventional heterojunction field-effect transistor described above with reference to FIG. 9. As a result, since the second electron transit channel formation semiconductor layer 21 also serves as an electron supply layer, the current value to be supplied to the load can be increased to be much larger than that in the conventional heterojunction field-effect transistor of FIG. 9.

Figure 3:
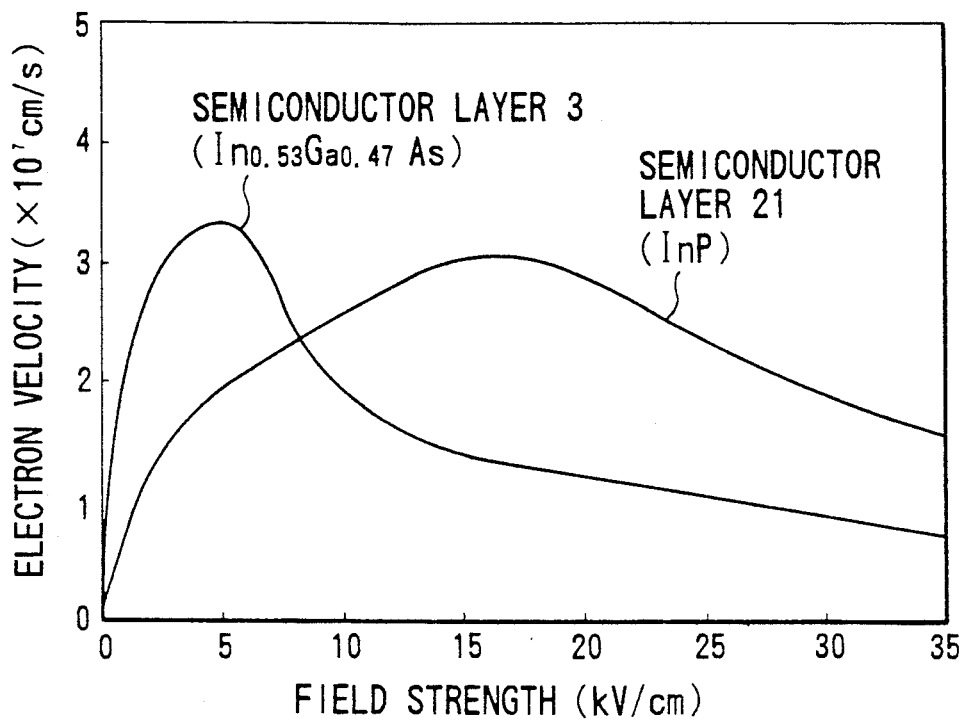
FIG. 3 is a graph showing an electron velocity ($\times 10^7$ cm/s) as a function of a field strength (kV/cm) in a channel formation semiconductor layer and a second electron transit semiconductor layer in the heterojunction field-effect transistor according to the present invention shown in FIG. 1.
Figure 9:
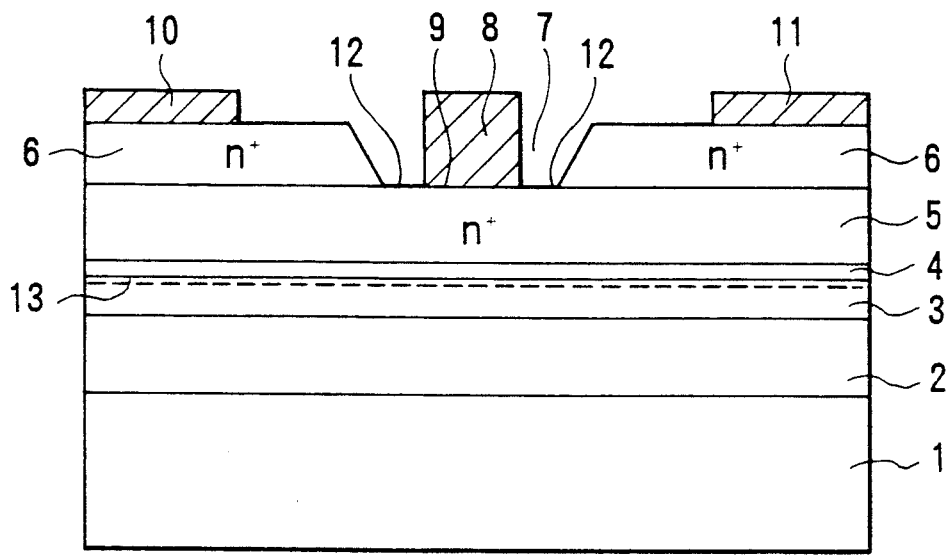
FIG. 9 is a schematic sectional view showing a conventional heterojunction field-effect transistor.

In the heterojunction field-effect transistor shown in FIG. 1, in each of the compound semiconductors constituting the first and second electron transit channel formation semiconductor layers 3 and 21, the velocity of electrons transiting in it has a field strength dependency, as in the conventional heterojunction field-effect transistor shown in FIG. 9. As shown in FIG. 3, the electron velocities in the compound semiconductor ($In_{0.53}Ga_{0.47}As$ in FIG. 1) constituting the first electron transit channel formation semiconductor layer 3 and the compound semiconductor (InP in FIG. 1) constituting the second electron transit channel formation semiconductor layer 21 have their maximum values at different field strength positions. Therefore, in the electron transit channel formation semiconductor layers 3 and 21, electrons transit at a high velocity in the electron transit channel formation semiconductor layer 3 in a portion of a region below the gate electrode 8, which is located on the side of the source electrode 10 and in which the field strength is low. On the other hand, in a portion of the region below the gate electrode 8, which is located on the side of the drain electrode 11 and in which the field strength is high, in the electron transit channel formation semiconductor layers 3 and 21, the kinetic energy of electrons is high and the potential energy of the electron conduction band of the second electron transit channel formation semiconductor layer 21 is reduced to be close to the Fermi level by the n-type impurity at a high concentration, as indicated by a thick line b in FIG. 2 (see FIG. 2). Therefore, the probability of presence of electrons in the second electron transit channel formation semiconductor layer 21 is increased to facilitate movement of electrons from the first electron transit channel semiconductor layer 3. For this reason, the average electron velocity in the region below the gate electrode 8 can be increased compared with that in the conventional heterojunction field-effect transistor shown in FIG. 9. Therefore, high-frequency characteristics as a field-effect transistor better than those obtained by the conventional heterojunction field-effect transistor of FIG. 9 can be obtained.

In the heterojunction field-effect transistor according to the present invention, when the threshold voltage is applied to the gate electrode 8 with respect to the source electrode 10, a field strength $E_s$ in the Schottky junction 9 is given by $E_s = 2(-V_{bi} - V_{th})/d - N_1(d_1^2 + d_0 + d)/(2d\epsilon)$ where $N_1$ is the concentration of the n-type impurity in the second electron transit channel formation semiconductor layer 21, $d_1$ is the thickness of the second electron transit channel formation semiconductor layer 21, d is the thickness of the electron supply semiconductor layer 5, $d_0$ is the thickness of the first electron transit channel formation semiconductor layer 3, and $V_{bi}$ is the built-in potential present in the electron supply semiconductor layer 5, the spacer semiconductor layer 4, and the first electron transit channel formation semiconductor layer 3. As is apparent from this equation, the field strength of the Schottky junction 9 becomes lower than that in the conventional heterojunction field-effect transistor described above with reference to FIG. 9. Therefore, the gate breakdown voltage can be increased compared with that of the conventional heterojunction field-effect transistor of FIG. 9, or d can be decreased without reducing the gate breakdown voltage compared with the conventional heterojunction field-effect transistor of FIG. 9, thereby increasing the transconductance. As a result, in the heterojunction field-effect transistor according to the present invention, a design margin is increased to improve the device characteristics compared with the conventional heterojunction field-effect transistor shown in FIG. 9.

Figure 4:
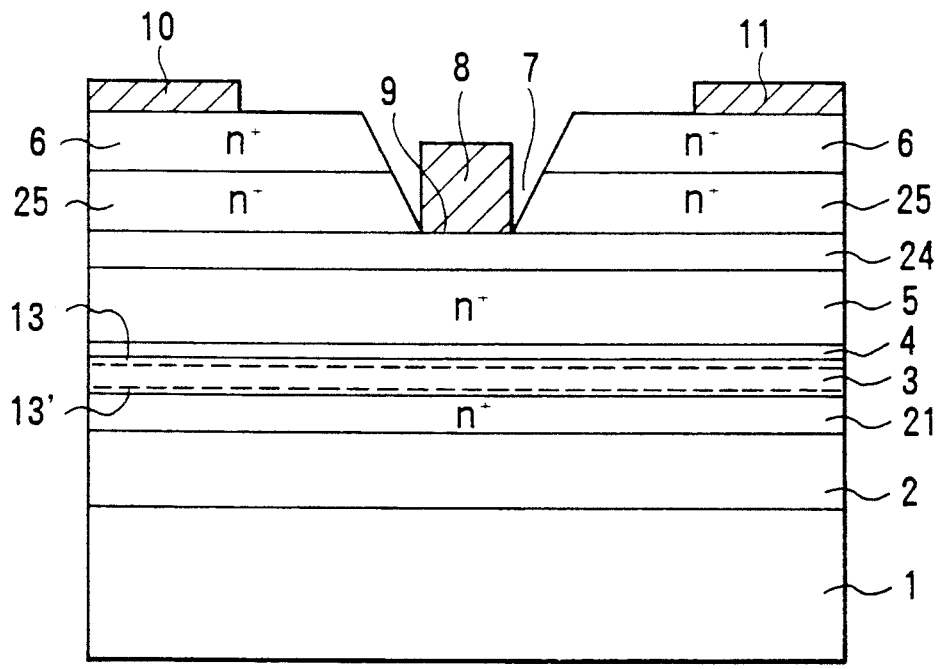
FIG. 4 is a schematic sectional view showing the second embodiment of the heterojunction field-effect transistor according to the present invention.

The second embodiment of the heterojunction field-effect transistor according to the present invention will be described below with reference to FIG. 4. Note that the same reference numerals as in FIG. 1 denote the same parts in FIG. 4 and a detailed description thereof will be omitted. The heterojunction field-effect transistor according to the present invention shown in FIG. 4 has the same arrangement as that of the heterojunction field-effect transistor of the first embodiment described above with reference to FIG. 1 except for the following points.

That is, a Schottky formation semiconductor layer 24 and an ohmic resistance reduction semiconductor layer 25 are formed between an electron supply semiconductor layer 5 and an electrode mounting semiconductor layer 6 such that the Schottky formation semiconductor layer 24 is arranged on the side of the electron supply semiconductor layer 5.

The Schottky formation semiconductor layer 24 has the same arrangement as that of a spacer semiconductor layer 4, i.e., consists of a compound semiconductor such as InAlAs having electron affinity smaller than that of a first electron transit channel formation semiconductor layer 3 and is intentionally not doped with either an n- or p-type impurity or doped with either impurity at only a sufficiently low concentration. The Schottky formation semiconductor layer 24 has a thickness smaller than the diffusion length of electrons in it.

The ohmic resistance reduction semiconductor layer 25 consists of a compound semiconductor having electron affinity smaller than that of the electron transit channel formation semiconductor layer 3, e.g., the same InAlAs as that of the Schottky formation semiconductor layer 24 and is doped with an n-type impurity at a high concentration.

A window (this window, together with a window of the electrode mounting semiconductor layer 6, will be referred to as the window 7 hereinafter), which communicates with the window 7 of the electrode mounting semiconductor layer 6 and externally exposes the Schottky formation semiconductor layer 24, is formed in the ohmic resistance reduction semiconductor layer 25. A gate electrode 8 is mounted on the Schottky formation semiconductor layer 24, instead of the electron supply semiconductor layer 5 in FIG. 1, so as to form a Schottky junction 9.

The foregoing is an arrangement of the second embodiment of the heterojunction field-effect transistor according to the present invention.

According to the second embodiment of the heterojunction field-effect transistor according to the present invention having the above arrangement, since the arrangement is the same as that of the heterojunction field-effect transistor of the present invention described above with reference to FIG. 1 except for the above-mentioned points, the same functions and effects as those of the heterojunction field-effect transistor according to the present invention shown in FIG. 1 can be obtained. In addition, the gate electrode 8 is not directly mounted on the electron supply semiconductor layer 5 but mounted on the Schottky formation semiconductor layer 24 which is formed on the electron supply semiconductor layer 5 and is intentionally not doped with either an n- or p-type impurity or is doped with either impurity at only a sufficiently low concentration. Therefore, the Schottky junction 9 is formed better than in the case of the heterojunction field-effect transistor shown in FIG. 1. Consequently, characteristics better than those of the heterojunction field-effect transistor of FIG. 1 can be obtained.

Figure 5:
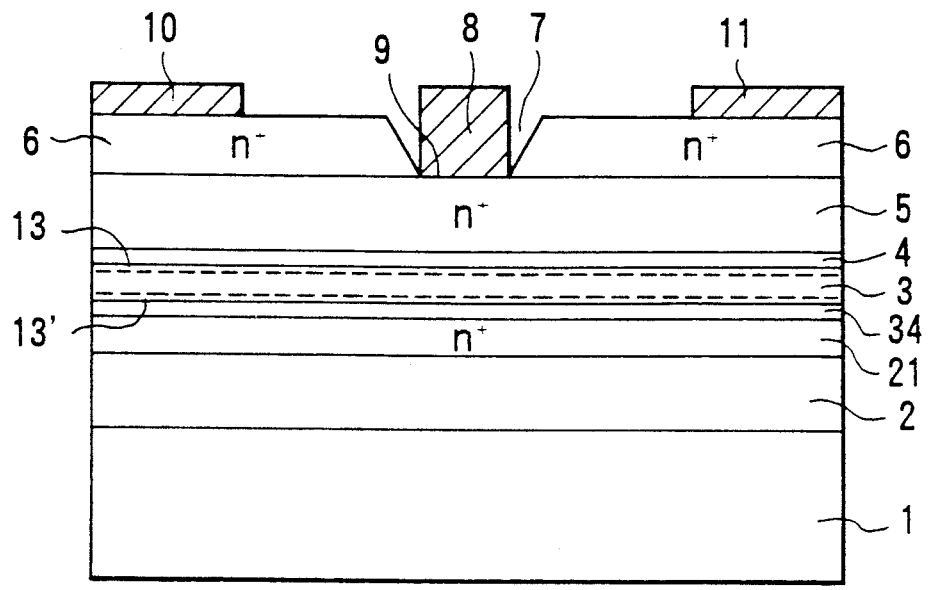
FIG. 5 is a schematic sectional view showing the third embodiment of the heterojunction field-effect transistor according to the present invention.

The third embodiment of the heterojunction field-effect transistor according to the present invention will be described below with reference to FIG. 5. Note that the same reference numerals as in FIG. 1 denote the same parts in FIG. 5 and a detailed description thereof will be omitted. The heterojunction field-effect transistor according to the present invention shown in FIG. 5 has the same arrangement as that of the heterojunction field-effect transistor of the first embodiment shown in FIG. 1 except for the following point.

In this embodiment, a second spacer semiconductor layer 34 is formed between first and second electron transit channel formation semiconductor layers 3 and 21. The second spacer semiconductor layer 34 consists of a compound semiconductor having electron affinity smaller than that of the electron transit channel formation semiconductor layer 3 and larger than those of a spacer semiconductor layer 4, an electron supply semiconductor layer 5, and a buffer semiconductor layer 2, and is intentionally not doped with either an n- or p-type impurity or is doped with either impurity at only a sufficiently low concentration.

The foregoing is an arrangement of the third embodiment of the heterojunction field-effect transistor according to the present invention.

The heterojunction field-effect transistor having the above arrangement has the same arrangement as that of the heterojunction field-effect transistor according to the present invention described above with reference to FIG. 1 except for the above-mentioned point, so that the same functions and effects as the first embodiment can be obtained. In addition, since the second spacer semiconductor layer 34 is formed, electrons in the first electron transit channel formation semiconductor layer 3 can effectively avoid Coulomb scattering from an n-type impurity at a high concentration in the second electron transit channel formation semiconductor layer 21. Therefore, the electron velocity in the electron transit channel formation semiconductor layer 3 is increased to make it possible to improve high-frequency characteristics compared with the heterojunction field-effect transistor according to the first embodiment of FIG. 1.

Figure 6:
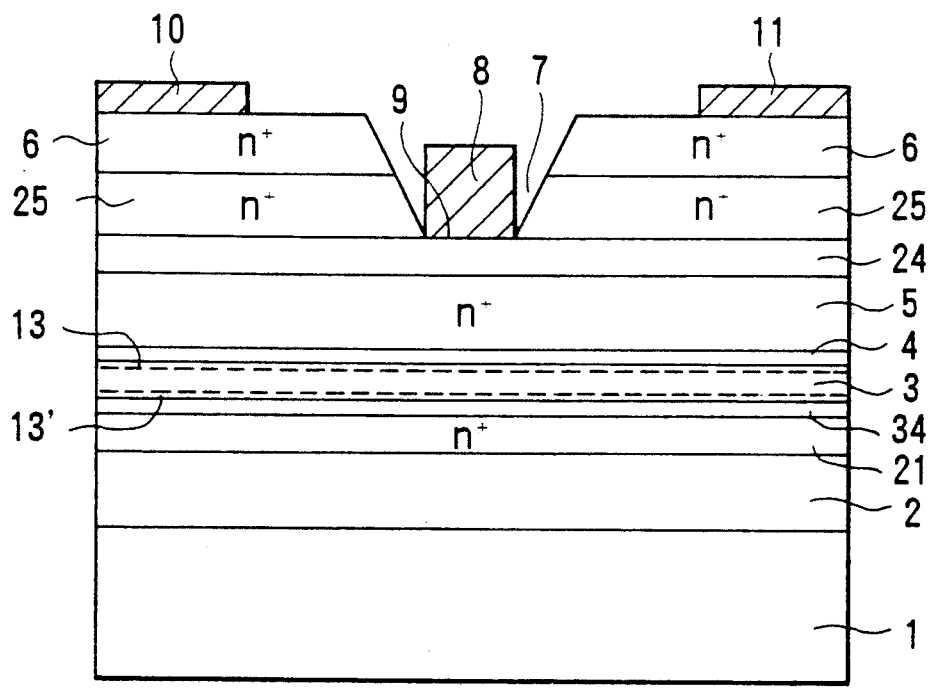
FIG. 6 is a schematic sectional view showing the fourth embodiment of the heterojunction field-effect transistor according to the present invention.

The fourth embodiment of the heterojunction field-effect transistor according to the present invention will be described below with reference to FIG. 6. Note that the same reference numerals as in FIG. 4 denote the same parts in FIG. 6 and a detailed description thereof will be omitted. The heterojunction field-effect transistor shown in FIG. 6 has the same arrangement as that of the heterojunction field-effect transistor of the second embodiment shown in FIG. 4 except for the following point.

That is, similar to the heterojunction field-effect transistor according to the present invention as described above with reference to FIG. 5, a second spacer semiconductor layer 34 is formed between first and second electron transit channel formation semiconductor layers 3 and 21. The second spacer semiconductor layer 34 consists of a compound semiconductor having electron affinity smaller than that of the first electron transit channel formation semiconductor layer 3 and larger than those of a spacer semiconductor layer 4, an electron supply semiconductor layer 5, and a buffer semiconductor layer 2, and is intentionally not doped with either an n- or p-type impurity or is doped with either impurity at only a sufficiently low concentration.

The foregoing is an arrangement of the fourth embodiment of the heterojunction field-effect transistor according to the present invention.

The heterojunction field-effect transistor having the above arrangement has the same arrangement as that of the heterojunction field-effect transistor according to the present invention described above with reference to FIG. 4 except for the above-mentioned point, so that the same functions and effects as the embodiment of FIG. 4 can be obtained. In addition, since the second spacer semiconductor layer 34 is formed, electrons in the first electron transit channel formation semiconductor layer 3 can effectively avoid Coulomb scattering from an n-type impurity at a high concentration in the second electron transit channel formation semiconductor layer 21, as in the heterojunction field-effect transistor described above with reference to FIG. 5. Therefore, the electron velocity in the electron transit channel formation semiconductor layer 3 is increased to make it possible to improve high-frequency characteristics compared with the heterojunction field-effect transistor according to the second embodiment of FIG. 4.

The fifth embodiment of the heterojunction field-effect transistor according to the present invention will be described below with reference to FIG. 7. Note that the same reference numerals as in FIG. 1 denote the same parts in FIG. 7 and a detailed description thereof will be omitted. The heterojunction field-effect transistor according to the present invention shown in FIG. 7 has the same arrangement as that of the heterojunction field-effect transistor according to the present invention shown in FIG. 1 except for the following point.

Figure 7:
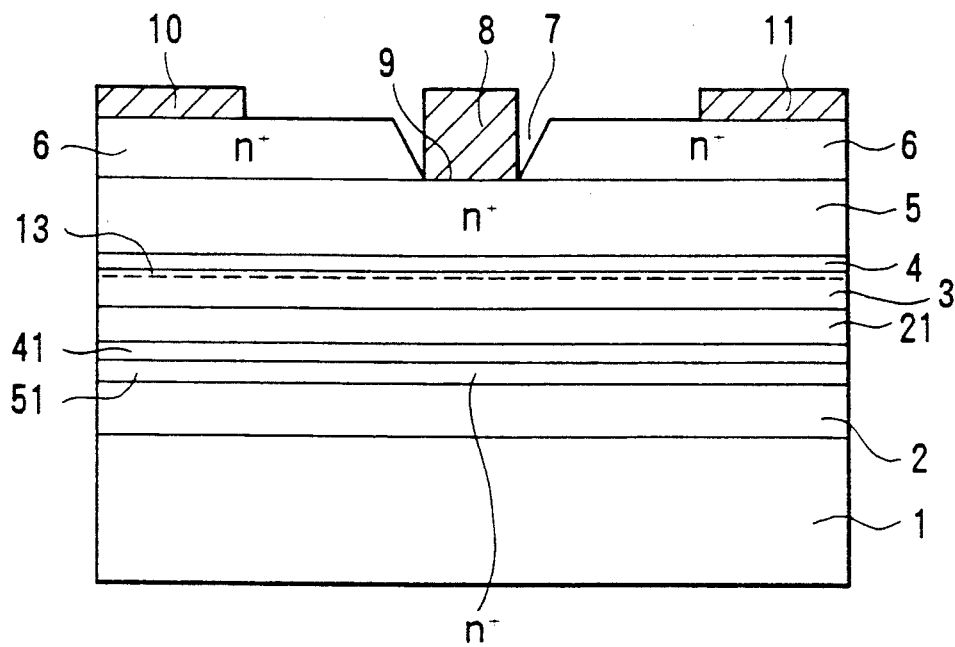
FIG. 7 is a schematic sectional view showing the fifth embodiment of the heterojunction field-effect transistor according to the present invention.

Referring to FIG. 7, in place of the second electron transit channel formation semiconductor layer 21 having an n-type impurity at a high concentration in the heterojunction field-effect transistor of FIG. 1, the following three layers are formed between a buffer semiconductor layer 2 and an electron transit channel formation semiconductor layer 3. That is, one of the three layers is a second electron transit channel formation semiconductor layer 21 which consists of a compound semiconductor such as InP having electron affinity smaller than that of the first electron transit channel formation semiconductor layer 3 and larger that those of a spacer semiconductor layer 4 and an electron supply semiconductor layer 5 and having the maximum value of an electron velocity at a field strength position different from that in the first electron transit channel formation semiconductor layer 3, and is intentionally not doped with either an n- or p-type impurity or is doped with either impurity at only a sufficiently low concentration. The second one of the three layers is a third spacer semiconductor layer 41 formed below the second electron transit semiconductor layer 21. The third spacer semiconductor layer 41 consists of a compound semiconductor such as InAlAs having electron affinity smaller than that of the second electron transit channel formation semiconductor layer 21, and is intentionally not doped with an n- or p-type impurity or is doped with either impurity at only a sufficiently low concentration. The last one of the three layers is a second electron supply semiconductor layer 51 formed below the third spacer semiconductor layer 4. The second electron supply semiconductor layer 51 consists of a compound semiconductor such as InAlAs having electron affinity smaller than that of the second electron transit channel formation semiconductor layer 21, and is doped with an n-type impurity at a high concentration.

The foregoing is an arrangement of the fifth embodiment of the heterojunction field-effect transistor according to the present invention.

Figure 8:
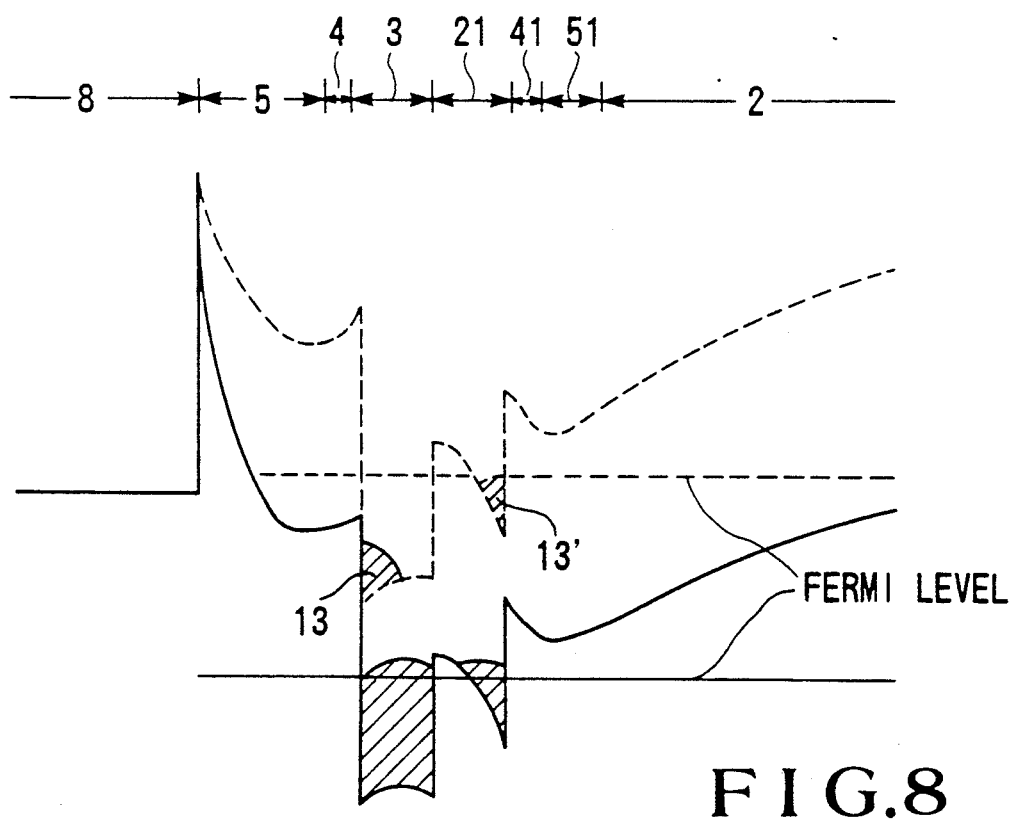
FIG. 8 is a band diagram for explaining the fifth embodiment.

Since the heterojunction field-effect transistor having the above arrangement has the second electron supply semiconductor layer 51, a two-dimensional electron gas 13' is formed in the second electron transit channel formation semiconductor layer 21 for the same reason as a two-dimensional electron gas 13 is formed in the first electron transit channel formation semiconductor layer 3, as shown in FIG. 8. In addition, the heterojunction field-effect transistor of this embodiment has the same arrangement as that of the heterojunction field-effect transistor according to the embodiment of shown in FIG. 1, so that the same functions and effects as those of the heterojunction field-effect transistor of FIG. 1 can be obtained.

Also in this heterojunction field-effect transistor having the arrangement shown in FIG. 7, since the second electron semiconductor layer 51 has an n-type impurity at a high concentration, the potential energy in the electron conduction band of the second electron transit channel formation semiconductor layer 21 is reduced to increase the probability at which electrons exist in the second electron transit channel formation semiconductor layer 21. Therefore, the same effect as that of the heterojunction field-effect transistor of the first embodiment shown in FIG. 1 can be obtained for the same reason.

Note that the present invention is not limited to the above embodiments. For example, the spacer semiconductor layer 4 may be omitted from each arrangement of the above embodiments, or the ohmic resistance reduction semiconductor layer 25 may be omitted from each arrangement of FIGS. 4 and 6. In addition, an ohmic resistance reduction semiconductor layer or a Schottky formation semiconductor layer may be formed in the embodiment shown in FIG. 7, or the spacer semiconductor layer 4 may be removed from the arrangement of FIG. 1. Furthermore, various changes and modifications can be made without departing from the spirit of the present invention.

What is claimed is:

1. A heterojunction field-effect transistor comprising:
a first electron transit channel formation semiconductor layer formed on a substrate and consisting of a compound semiconductor;
a first electron supply semiconductor layer formed on said first electron transit channel formation semiconductor layer and consisting of a compound semiconductor;
a gate electrode, a source electrode, and a drain electrode formed on said first electron supply semiconductor layer; and
a second electron transit channel formation semiconductor layer formed between said substrate and said first electron transit channel formation semiconductor layer,
wherein said second electron transit channel formation semiconductor layer consists of a compound semiconductor which has electron affinity smaller than that of said first electron transit channel formation semiconductor layer and larger than that of said first electron supply semiconductor layer, and is different from said first electron transit channel formation semiconductor layer in field strength position where a maximum value of an electron velocity is obtained, and is arranged such that an energy level on a bottom of an electron conduction band of said second electron transit channel formation semiconductor layer is substantially the same as a Fermi level.

2. A transistor according to claim 1, wherein said second electron transit channel formation semiconductor layer consists of a compound semiconductor doped with an n-type impurity.

3. A transistor according to claim 2, further comprising a spacer semiconductor layer formed between said first and second electron transit channel formation semiconductor layers,
wherein said spacer semiconductor layer prevents electrons transiting in said first electron transit channel formation semiconductor layer from being scattered by the impurity in said second electron transit channel formation semiconductor layer.

4. A transistor according to claim 1, wherein said second electron transit channel formation semiconductor layer consists of a nondoped compound semiconductor.

5. A transistor according to claim 1, further comprising a second electron supply semiconductor layer formed between said second electron transit channel formation semiconductor layer and said substrate and consisting of an n-type impurity.

6. A transistor according to claim 5, wherein said second electron transit channel formation semiconductor layer consists of a nondoped compound semiconductor.

7. A transistor according to claim 5, further comprising a spacer semiconductor layer formed between said second electron transit channel formation semiconductor layer and said second electron supply semiconductor layer,
wherein said spacer semiconductor layer prevents electrons transiting in said second electron transit channel formation semiconductor layer from being scattered by the impurity in said second electron supply semiconductor layer.

8. A transistor according to claim 1, further comprising a spacer semiconductor layer formed between said first electron supply semiconductor layer and said first electron transit channel formation semiconductor layer,
wherein said spacer semiconductor layer prevents electrons transiting in said first electron transit channel formation semiconductor layer from being scattered by the impurity in said first electron supply semiconductor layer.

9. A transistor according to claim 1, further comprising a buffer semiconductor layer formed between said second electron transit channel formation semiconductor layer and said substrate.

* * * * *

UNITED STATES PATENT AND TRADEMARK OFFICE
CERTIFICATE OF CORRECTION

PATENT NO. : 5,151,757
DATED : September 29, 1992
INVENTOR(S) : Enoki et al.

It is certified that error appears in the above-identified patent and that said Letters Patent is hereby corrected as shown below:

In [57] ABSTRACT:

at the 14th line, replace "of a cmpound" with --of a compound--;

at the 20th line, replace "formation seimconductor layer" with --formation semiconductor layer--.

Signed and Sealed this

Nineteenth Day of September, 1995

Attest:

BRUCE LEHMAN

Attesting Officer

Commissioner of Patents and Trademarks